(12) United States Patent
Sheu et al.

(10) Patent No.: US 6,380,587 B1
(45) Date of Patent: Apr. 30, 2002

(54) SEMICONDUCTOR READ-ONLY MEMORY DEVICE AND METHOD OF FABRICATING THE SAME

(75) Inventors: Shing-Ren Sheu, TaoYuan; Chung-Hsien Wu; Chih-Ming Huang, both of Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/706,527

(22) Filed: Nov. 3, 2000

Related U.S. Application Data

(62) Division of application No. 09/215,618, filed on Dec. 17, 1998.

(30) Foreign Application Priority Data

Jun. 22, 1998 (TW) .......................................... 87109985

(51) Int. Cl.$^7$ .......................... H01L 29/76; H01L 29/94
(52) U.S. Cl. ...................................... 257/330; 257/303
(58) Field of Search ................................. 257/330, 303

(56) References Cited

U.S. PATENT DOCUMENTS 5,744,393 A * 4/1998 Risch
5,959,328 A * 9/1999 Krautschneider et al.

* cited by examiner

Primary Examiner—Stephen D. Meier
(74) Attorney, Agent, or Firm—J.C. Patents

(57) ABSTRACT

A semiconductor read-only memory (ROM) and a method of fabricating the same are provided. The ROM device is structured in such a manner that allows the fabrication to include a fewer number of mask processes. This makes it more cost effective and allows a cycle time that is shorter than that of the prior art. Moreover, the particular structure of the ROM device makes punchthrough less likely to occur between any neighboring pairs of the buried bit lines when the ROM device is further scaled down. The ROM device is constructed on a semiconductor substrate which is partitioned into a peripheral region and a cell region. A plurality of STI structures are formed at predefined locations in both the peripheral region and the cell region. Immediately after this, a first ion-implantation process can be performed on the cell region to form a plurality of buried bit lines. Subsequently, the dielectric isolation layers in all of the STI structures in the cell region are removed, leaving a plurality of empty trenches behind. A conformal insulating layer and a conductive layer are then successively formed over the wafer, and the conductive layer is further selectively removed to form a word line in the cell region and a gate in the peripheral region. In the code implantation process, selected channel regions between the buried bit lines are doped with impurities for code implantation of data into the ROM device.

3 Claims, 6 Drawing Sheets

SEMICONDUCTOR READ-ONLY MEMORY DEVICE AND METHOD OF FABRICATING THE SAME

This application is a divisional application of, and claims the priority benefit of, U.S. application Ser. No. 09/215,618 filed on Dec. 17, 1998 pending at time of issue.

BACKGROUND OF THE INVENTION

1. Field of the Invention

This invention relates to semiconductors, and more particularly, to a new structure for semiconductor read-only memory (ROM) and a method of fabricating the same.

2. Description of Related Art

As computers become more powerful in performance, memories with very fast access speed and large storage capacity are in great demand. In computer systems, two major types of memories are used: ROM (read-only memory) and RAM (random-access memory). The ROM is used for permanent storage of repeatedly used program code and data. During computer operation, data can only be read from the ROM, whereas data can be read from and written into the RAM. There are various types of ROMs such as mask ROM, PROM (programmable ROM), EPROM (erasable programmable ROM), and EEPROM (electrically erasable and programmable ROM), to name a few.

In addition, a new type of EEPROM with a very fast access speed, called flash memory, has been developed by Intel Corporation of America. Flash memory is substantially identical in structure with conventional EEPROMs except that the erasure operation of the flash memory is carried out in a block-by-block manner rather than a bit-by-bit manner. The flash memory is therefore reprogrammed more quickly than the conventional EEPROMs, making it highly cost-effective to use and manufacture.

For a particular type of ROM, the various units supplied to the customers are typically identical in semiconductor structure except for the different data stored therein. Therefore, the ROM devices are customarily fabricated up to the stage where they are ready for data programming. The semi-finished products are then stocked in inventories to await customer orders. When a customer order is received, the data specified by the customer are then programmed into the semi-finished ROM devices by performing the so-called mask programming process. This procedure is now a standard practice in the semiconductor industry for the manufacture of ROMs.

Conventional ROM devices are typically based on MOS transistors serving as memory cells. Whether a certain memory cell stores the data value 0 or 1 is dependent on whether or not the channel region of the associated MOS transistor is doped with impurities. If doped, the channel region will be increased in threshold voltage, thus setting the associated MOS transistor to a permanently OFF state, representing the storage of a first data value, for example 0, into the memory cell. On the other hand, if not doped, the channel region will have a low threshold voltage that allows the associated MOS transistor to be set to a permanently ON state, representing the storage of a second data value, for example 1, into the memory cell. The ROM device access operation is carried out through word lines and bit lines that are interconnected to the memory cells in the ROM device To provide a more detailed description of the prior art, the structure of a conventional ROM device and the method of fabricating the same are illustratively depicted in the following with reference to FIGS. 1A–1E.

As shown in the top view of FIG. 1A, the conventional ROM device is constructed on a semiconductor substrate 100, such as a P-type silicon substrate. The substrate 100 is formed with a plurality of parallel-spaced $N^+$ source/drain regions 106 extending in a first direction 110, which serve as a plurality of buried bit lines for the ROM device. Further, a gate oxide layer 102 (see FIG. 1B) is formed over the substrate 100, covering all of the buried bit line 106. Next, a plurality of parallel-spaced gate regions 112a is formed over the gate oxide layer 102, extending in a second direction 120. Preferably, the second direction 120 is perpendicular to the first direction 110. These gate regions 112a serve as word lines for the ROM device. The gate regions 112a intercross the buried bit lines 106 at a plurality of intersections. For each segment of the gate regions 112a between one neighboring pair of these intersections, a channel region is defined thereunder, as indicated by the region enclosed by a dashed box labeled with the reference numeral 107 in FIG. 1A. Each channel region 107 is associated with one memory cell of the ROM device. For each memory cell, whether it stores a data value 0 or 1 is dependent on whether or not the associated channel region 107 is doped with P-type impurities to vary the threshold voltage thereof. The ion-implantation process used for this purpose is customarily referred to as a code implantation process.

Detailed process steps taken to fabricate the foregoing ROM device are depicted in the following with reference to FIGS. 1B–1E.

FIG. 1B shows the case where the substrate 100 is P-type and the buried bit lines 106 ($N^+$ source/drain regions) in the substrate 100 are formed by doping a high concentration of N-type impurities into predefined regions in the substrate 100. One channel region 107 is formed between each neighboring pair of the buried bit lines 106.

One drawback to this structure is that, when the ROM device is scaled down for high integration, the buried bit lines 106 are scaled down as well, and thus have increased electrical resistance that slows the speed of accessing the ROM device. There are two solutions to increase the conductivity of the buried bit lines 106: one is to increase the concentration of the impurity ions doped therein; and the other is to form the buried bit lines 106 at a greater depth in the substrate 100. These two solutions, however, would make neighboring buried bit lines highly susceptible to punchthrough. Therefore, the channel region 107 between each neighboring pair of the bit lines 106 should be wide enough to prevent punchthrough.

After the buried bit lines 106 are formed, the next step is to form the gate oxide layer 102 through either a thermal oxidation process or a CVD (chemical-vapor deposition) process. Subsequently, a plurality of parallel-spaced polysilicon layers 104 extending in the second direction 120 are formed over the gate oxide layer 102 to a thickness of 1,000–4,000 Å (angstrom).

FIG. 1C illustrates the subsequent step, in which a conductive layer 112 is deposited over the entire top surface of the wafer, covering all of the polysilicon layers 104 and the buried bit lines 106. This conductive layer 112 is preferably formed from tungsten silicide ($WSi_x$)

FIG. 1D illustrates the subsequent step, in which a photolithographic and etching process is performed on the wafer so as to etch away selected portions of the $WSi_x$ conductive layer 112 until the surface of the gate oxide layer 102 is exposed, with the remaining portions being laid over the underlying polysilicon layers 104. These remaining portions of the $WSi_x$ conductive layer 112 then serve as a plurality of parallel-spaced word lines 112a extending in the second direction 120, perpendicular to the first direction 110.

FIG. 1E illustrates the subsequent step, in which sidewall spacers 114 are formed on the sidewalls of the word lines 112a. These sidewall spacers 114 can be formed by, for example, first depositing an insulating layer (not shown) through a CVD process, and then performing an anisotropic etch-back process on the insulating layer (not shown) until the top surface of the gate oxide layer 102 is exposed. The remaining portions then serve as the sidewall spacers 114. After this, a dielectric layer (not shown) is formed over the wafer. This completes the fabrication of the main structure of the ROM device.

Still one drawback to the foregoing ROM device, however, is that when the ROM device is further scaled down for higher integration, the smaller word lines have increased resistance, thus slowing the access speed to the ROM device. Moreover, when the channel regions between the buried bit lines are too small, neighboring buried bit lines become more susceptible to punchthrough. The downsizing of the ROM device is thus limited to an unsatisfactory level.

SUMMARY OF THE INVENTION

It is therefore an objective of the present invention to provide a new structure for a ROM device and a method of fabricating the same, which can make the bit pitch between neighboring bit lines greater than that in the prior art. This allows the channel regions between the same to be longer than those in the prior art, allowing the ROM device to be made with higher integration in a cost-effective process with reduced cycle time.

In accordance with the foregoing and other objectives of the present invention, a new structure for a ROM device and a method of fabricating the same are provided.

The ROM device is constructed on a semiconductor substrate which is partitioned into a peripheral region and a cell region. A plurality of STI (shallow-trench isolation) structures are formed at predefined locations in both the peripheral region and the cell region. Immediately after this, a first ion-implantation process can be performed on the cell region to form a plurality of buried bit lines. Subsequently, the dielectric isolation layers in all of the STI structures in the cell region are removed, leaving a plurality of empty trenches behind. A conformal insulating layer and a conductive layer are then successively formed over the wafer, and the conductive layer is further selectively removed to form a word line in the cell region and a gate in the peripheral region. In the code implantation process, selected channel regions between the buried bit lines are doped with impurities for code implantation of data into the ROM device.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the invention for fabricating a ROM device is disclosed in the following with reference to FIGS. 2A–2F.

Figure 1A:
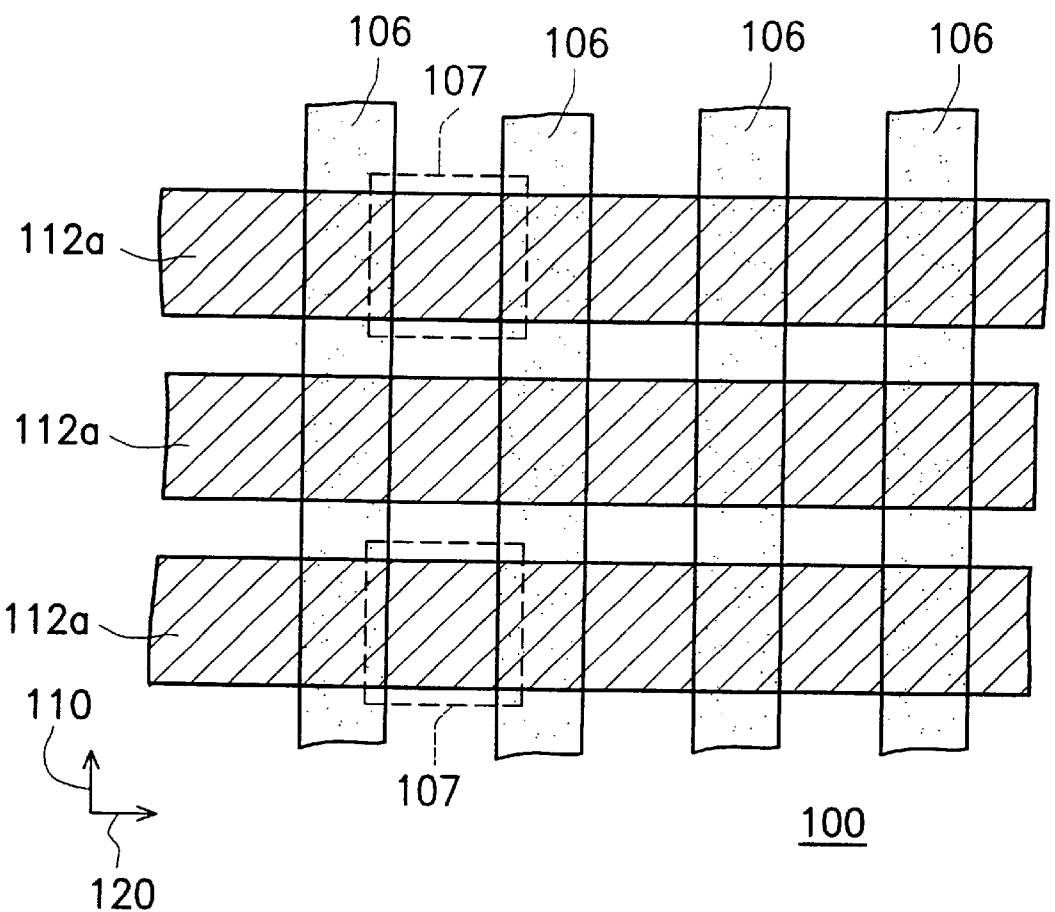
FIG. 1A is a schematic top view of a conventional ROM device.
Figure 1B:
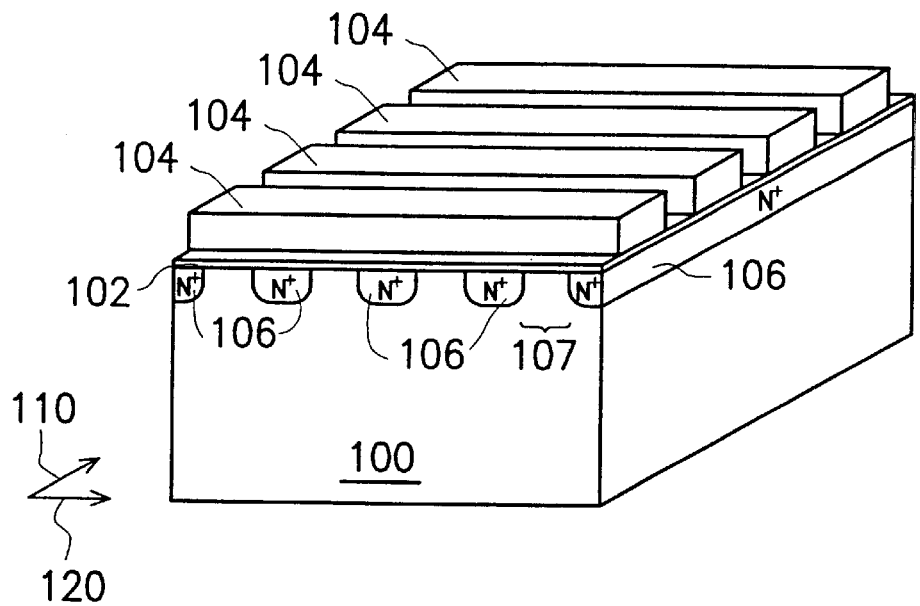
FIGS. 1B–1E are schematic perspective diagrams used to depict the steps involved in a conventional method for fabricating the ROM device of FIG. 1A.
Figure 1C:
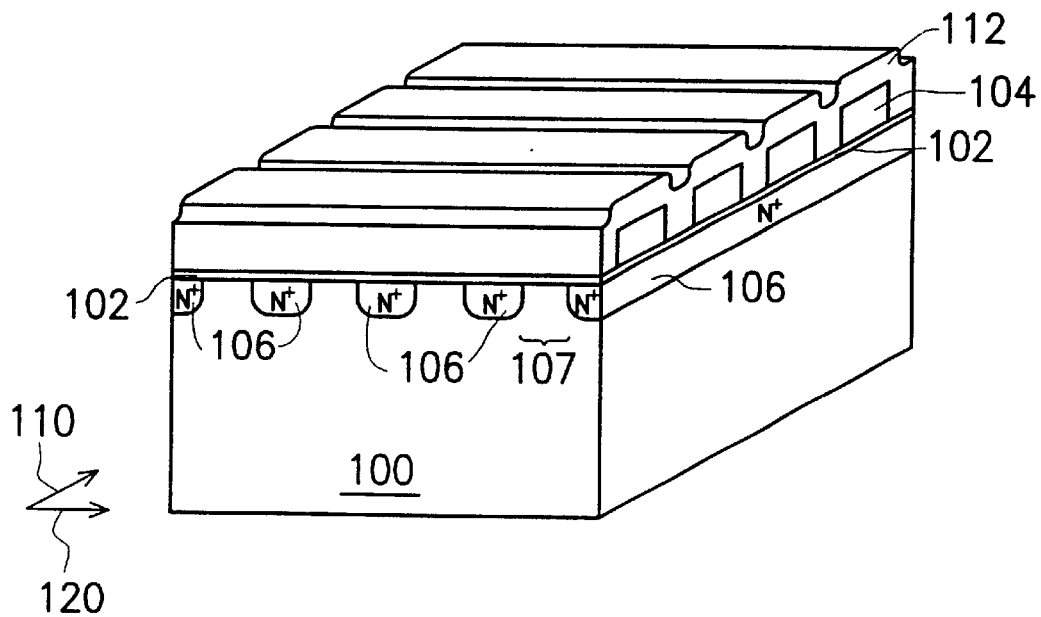
Figure 1D:
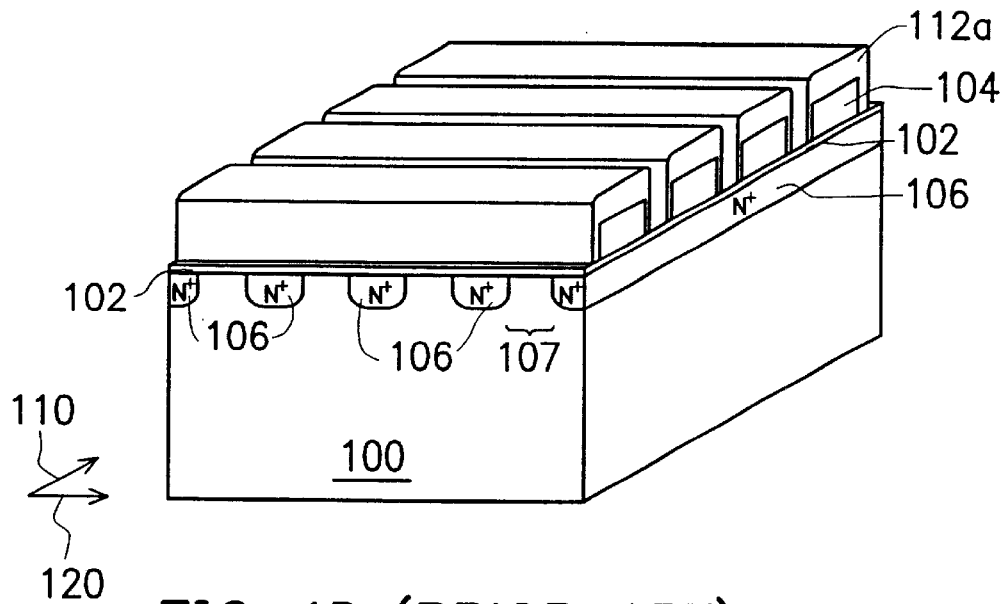
Figure 1E:
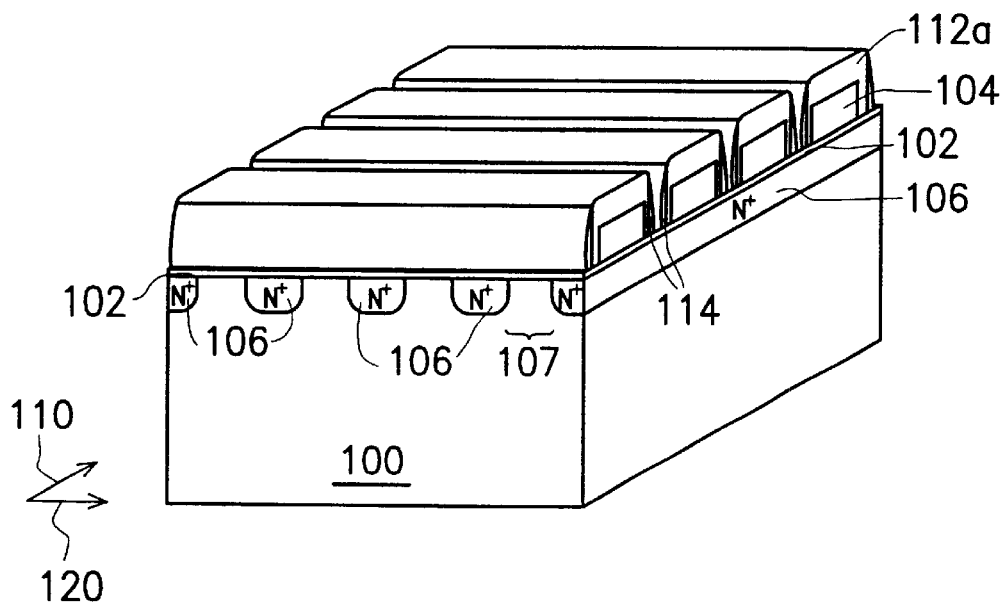
Figure 2A:
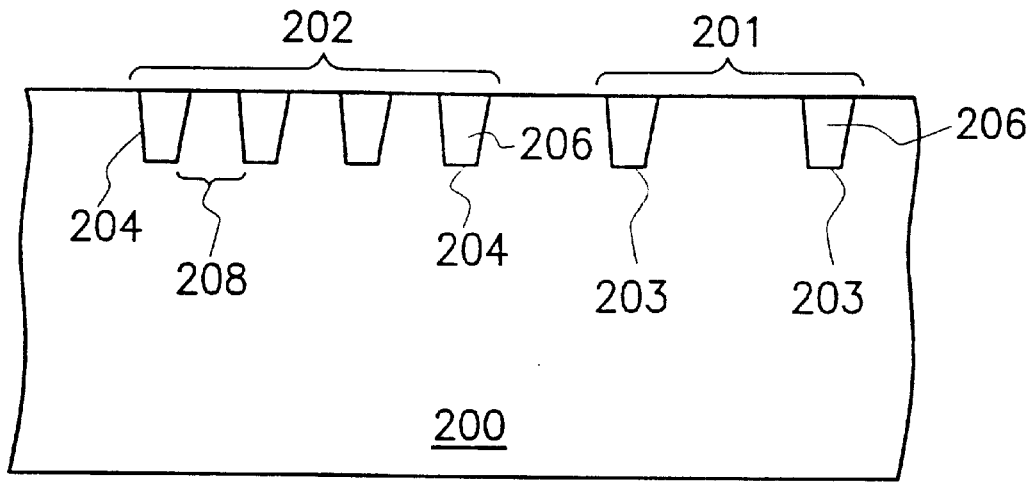
FIGS. 2A–2F are schematic sectional diagrams used to depict the steps involved in the method of the invention for fabricating a ROM device.

FIG. 2A illustrates the first step, in which a semiconductor substrate 200, such as a P-type silicon substrate, is prepared. The substrate 200 is partitioned into two regions: a peripheral region 201 and a ROM cell region 202. Then, STI (shallow-trench isolation) technique is used to form a plurality of STI structures at predefined locations in the substrate 200, including a plurality of first STI structures 203 in the peripheral region 201 and a plurality of second STI structures 204 in the cell region 202. The number of the second STI structures 204 is dependent on the predefined number of the buried bit lines that are to be formed in the cell region 202. The STI technique includes a first step of performing a photolithographic and etching process to form a plurality of trenches at selected locations in the substrate 200, and a second step of performing a CVD (chemical-vapor deposition) process to deposit a dielectric material, such as silicon oxide, into these trenches to form a dielectric isolation layer 206 in each of these trenches.

In the cell region 202, the substrate region between each neighboring pair of the second STI structures 204, such as the one designated by the reference numeral 208, is defined as the region in which one buried bit line is to be formed.

Figure 2B:
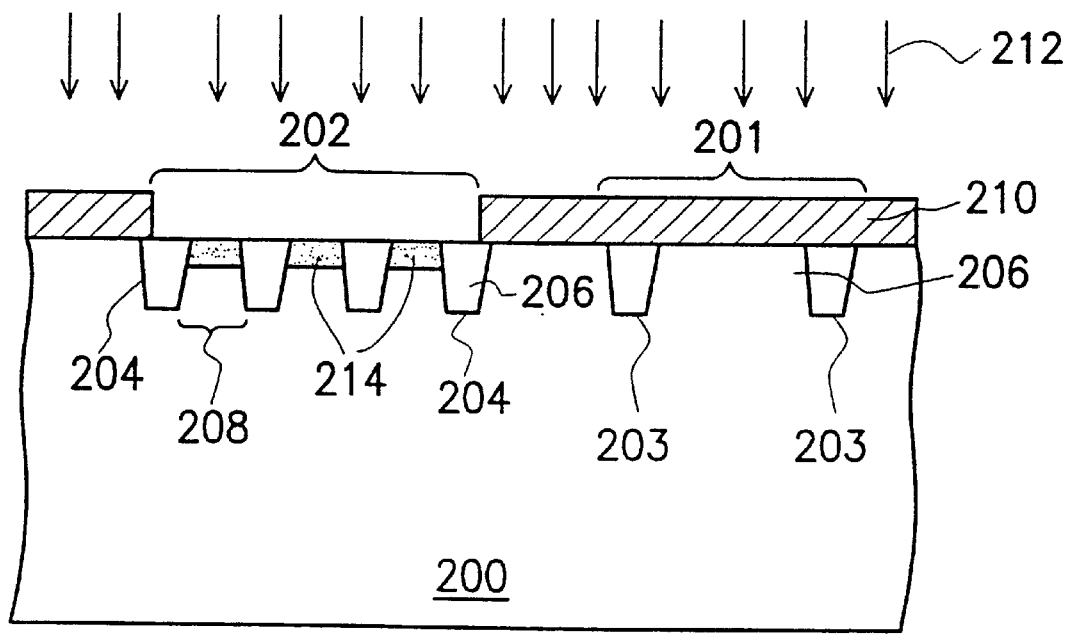

FIG. 2B illustrates the subsequent step, in which a first photoresist layer 210 is coated over the entire top surface of the wafer in such a manner that it covers the entire peripheral region 201 while exposing the entire cell region 202. Next, with the photoresist layer 210 serving as mask, a two-stage ion-implantation process is performed on the wafer. In the first stage, an impurity element 212, such as boron ($B^{11}$), is doped in ion form with a concentration of from $10^{11}$ to $10^{13}$ atoms/cm$^2$ into the substrate regions 208 between the second STI structures 204 to adjust the threshold voltage thereof. In the subsequent second stage, another impurity element, such as arsenic ($AS^{75}$), is doped in ion form with a concentration of $10^{11}$–$10^{12}$ atoms/cm$^2$ into the same substrate regions 208. Through this process, a plurality of buried bit lines 214 are formed in these substrate regions 208. It is to be noted that the buried bit lines 214 are formed at a depth in the substrate 200 that is shallower than the depth of the adjacent STI structures 204. This depth can be controlled by adjusting the energy of the ions with which the substrate 200 is bombarded in the ion-implantation process.

Figure 2C:
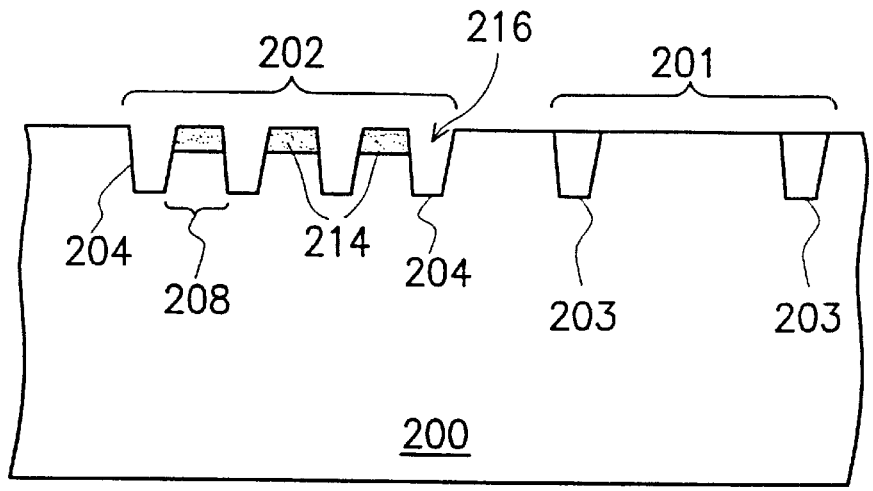

FIG. 2C illustrates the subsequent step, in which a removal process, such as a wet etching process, is performed with the photoresist layer 210 (see FIG. 2B, not shown in FIG. 2C) still covering the peripheral region 201, This removal process removes the dielectric isolation layers 206 from the second STI structures 204, leaving the second STI structures 204 with only the empty trenches 216. These trenches 216 have a depth in the substrate 200 that is greater than the depth of the adjacent buried bit lines 214. Since the peripheral region 201 is still covered by the photoresist layer 210 during the wet-etching process, the first STI structures 203 in the peripheral region 201 remain intact. After this, the entire photoresist layer 210 is removed.

Figure 2D:
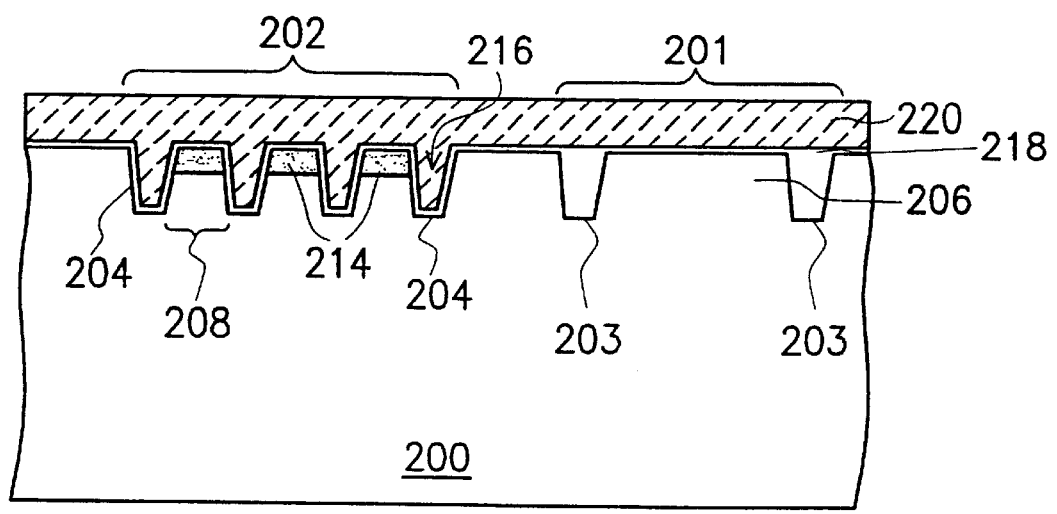

FIG. 2D illustrates the subsequent step, in which a conformal insulating layer 218 is formed to a substantially uniform thickness over all the exposed surfaces of the entire wafer, including a uniform thickness over the sidewalls of the trenches 216 in the cell region 202 but not entirely filling the trenches 216. The conformal insulating layer 218 is formed from a dielectric material, such as oxide, silicon nitride ($SiN_x$), or silicon oxide nitride ($SiON_x$), through a thermal oxidation process. Subsequently, a conductive layer 220 is formed over the conformal insulating layer 218, which fills all of the remaining empty portions of the trenches 216 in the cell region 202. The conductive layer 220 can be a polysilicon layer formed through a CVD process, or a silicide layer, such as a $WSI_x$ layer or a $CoSi_x$ layer. In the case of the conductive layer 220 being formed from polysilicon, the polysilicon layer can be further doped with impurities or covered with silicide, such as $WSI_x$ or $CoSi_x$, so as to increase the conductivity of the conductive layer 220.

Figure 2E:
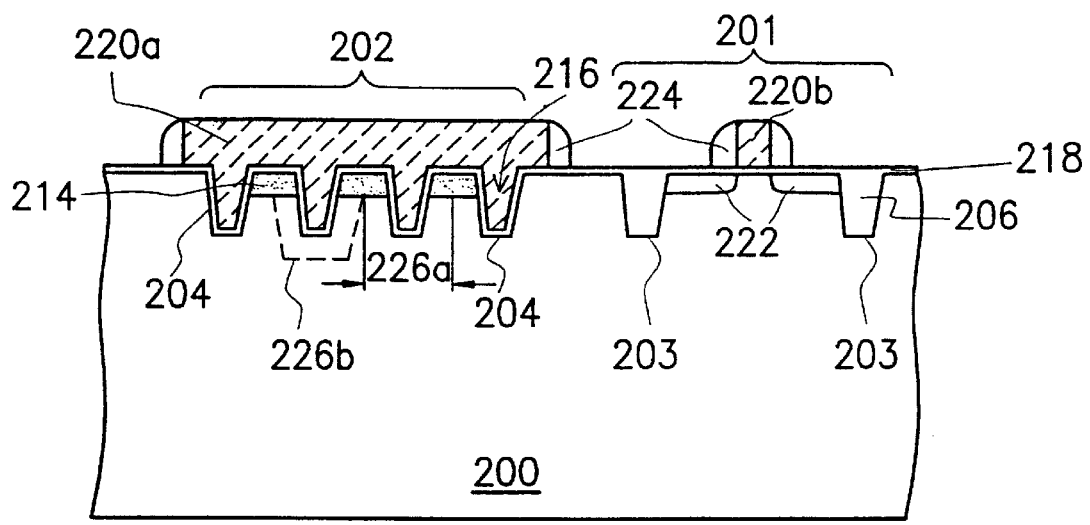

FIG. 2E illustrates the subsequent step, in which a photolithographic and etching process is performed on the conductive layer 220 so as to remove selected portions of the conductive layer 220. Through this process, a first remaining portion of the conductive layer 220, as designated by the reference numeral 220a, is laid over the cell region 202 to serve as a word line, and a second remaining portion, as designated by the reference numeral 220b, is laid over the peripheral region 201 to serve as a gate. After this, an ion-implantation process is performed to form a pair of N⁻ lightly doped regions 222 in the substrate regions on both sides of the gate 220b in the peripheral region 201.

Subsequently, sidewall spacers 224 are formed on the sidewalls of both the word line 220a and the gate 220b. These sidewall spacers 224 can be formed by, for example, first depositing an insulating layer (not shown) over the entire top surface of the wafer, and then performing an anisotropic etch-back process on the insulating layer until the surface of the conformal insulating layer 218 is exposed. The remaining portions then serve as the sidewall spacers 224.

In the next step, with the sidewall spacers 224 serving as a mask, an ion-implantation process is performed on the wafer so as to dope a high-concentration, N-type impurity element in ion form into the unmasked portions of the N⁻ lightly-doped regions 222, whereby the unmasked portions of the N⁻ lightly-doped regions 222 are turned into N⁺ heavily doped regions. Next, a thermal annealing process is performed on the wafer. The N⁻ lightly doped regions 222 in combination with the N⁺ heavily doped regions constitute a pair of LDD-based (lightly doped drain) source/drain regions. These source/drain regions 222, in association with the gate 220b, form an NMOS (N-type MOS) transistor in the peripheral region 201.

In the case of the substrate 200 being N-type, the source/drain regions 222 will be doped with P-type impurities to form a PMOS (P-type MOS) transistor in the peripheral region 201. Moreover, as an option, salicide can be formed in the peripheral region 201 so as to increase the conductivity of the metal interconnects in the peripheral region 201 to help increase the overall performance of the ROM device.

It is a characteristic feature of the invention that the bit pitch (i.e., the distance between each neighboring pair of the buried bit lines 214, as indicated by the reference numeral 226a in FIG. 2E, which measures from the center line of one buried bit line to that of the next) is shorter than the channel region, as indicated by the reference numeral 226b in FIG. 2E. between each neighboring pair of the buried bit lines 214. Therefore, when the ROM device is further scaled down, punchthrough is less likely to occur between any neighboring pairs of the buried bit lines 214. The invention is thus more advantageous in utilization than the prior art.

Figure 2F:
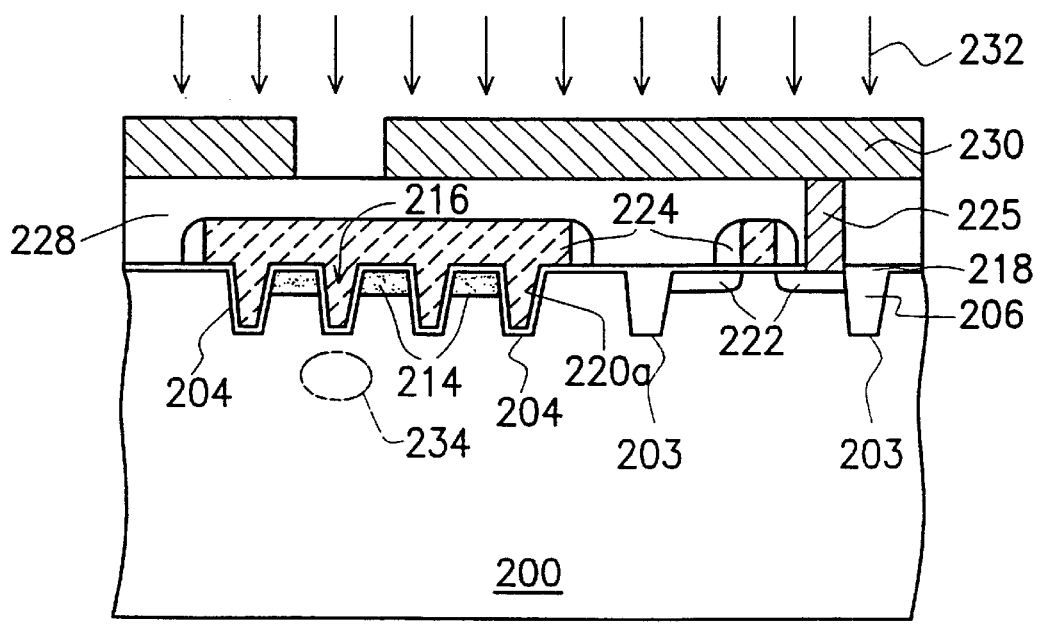

FIG. 2F illustrates the subsequent step, in which a dielectric layer 228 is formed over the entire top surface of the wafer, covering all of the currently formed components over the substrate 200. The dielectric layer 228 can be formed, for example, from phosphosilicate glass (PSG) or borophosphosilicate glass (BPSG) through a chemical-vapor deposition (CVD) process. The dielectric layer 228 can also be formed from tetra-ethyl-ortho-silicate (TEOS) through an atmospheric-pressure chemical-vapor deposition (APCVD) process. After this, a conductive plug 225 is formed at a predefined location in the dielectric layer 228, which is electrically connected to one of the source/drain regions 222 in the peripheral region 201. This conductive plug 225 can be formed by, for example, first performing a photolithographic and etching process on the dielectric layer 228 so as to form a contact window to expose one of the source/drain regions 222 in the peripheral region 201, and then filling the contact window with a conductive material such as a metal.

In the next step, a second photoresist layer 230 is formed over the entire top surface of the wafer, which is then selectively removed in such a manner as to form an opening directly above a selected channel region, for example the one designated by the reference numeral 234 in FIG. 2F, that is to be doped for permanent storage of a certain data value into the memory cell. Subsequently, with the photoresist layer 230 serving as a mask, an ion-implantation process is performed on the wafer so as to dope an impurity element 232, such as boron ($B^{11}$), in ion form with a concentration of from $5.0 \times 10^{13} - 1.0 \times 10^{14}$ atoms/cm², into the selected channel region 234 in the cell region 202 of the substrate 200. As a result, the channel region 234 is doped with impurity ions, representing the programming of a certain data value thereinto.

Subsequently, conventional processes are performed to complete the fabrication of the ROM device. These processes are not within the spirit and scope of the invention, so description thereof will not be further detailed.

In conclusion, the invention has the following advantages over the prior art.

(1) First, the invention allows the buried bit lines in the ROM device to be formed between a plurality of STI structures that are formed in the cell region together with the STI structures in the peripheral region and then through an ion-implantation process only in the cell region, thus requiring no additional photolithographic and etching processes. The manufacture of the ROM device is therefore less complex in process steps, making it more cost-effective to implement with a reduced cycle time when compared to the prior art.

(2) Second, the invention allows the bit pitch (i.e., the distance between each neighboring pair of the buried bit lines) to be shorter than the channel region between each neighboring pair of the buried bit lines. Therefore, when the ROM device is further scaled down, punch-through is less likely to occur between any neighboring pairs of the buried bit lines. The invention is thus more advantageous in utilization than the prior art, and more suitable for use in the fabrication of PROM, EPROM, EEPROM, and flash memory.

(3) Third, the process steps involved in the method of the invention are compatible with existing semiconductor fabrication processes, making the invention highly suitable for adoption into utilization.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A ROM device, which comprises:

a semiconductor substrate of a first semiconductor type, the substrate being formed with a plurality of trenches at predefined locations;

a plurality of buried bit lines of a second semiconductor type, each of the buried bit line being formed between one neighboring pair of the trenches at a depth in the substrate shallower than the depth of the trenches;

a conformal insulating layer formed to a substantially uniform thickness over the buried bit lines and over the sidewalls of the trenches, but not entirely filling the trenches; and a word line formed from a conductive material over the conformal insulating layer, which entirely fills the trenches.

2. The ROM device of claim 1, wherein the conformal insulating layer is formed from a dielectric material selected from the group consisting of oxide, silicon nitride ($SiN_x$), and silicon oxide nitride ($SiON_x$).

3. The ROM device of claim 1, wherein the conductive material used to form the word line is selected from the group consisting of polysilicon and metal silicide.

* * * * *